United States Patent
Kim et al.

(10) Patent No.: US 9,859,485 B1
(45) Date of Patent: Jan. 2, 2018

(54) METHOD FOR PACKAGING THERMOELECTRIC MODULE

(71) Applicant: Hyundai Motor Company, Seoul (KR)

(72) Inventors: Byung Wook Kim, Seongnam-si (KR); Kyong Hwa Song, Seoul (KR); Jin Woo Kwak, Gyeongsan-si (KR); Gyung Bok Kim, Yongin-si (KR); In Woong Lyo, Suwon-si (KR); Han Saem Lee, Seoul (KR)

(73) Assignee: Hyundai Motor Company, Seoul (KR)

( * ) Notice: Subject to any disclaimer, the term of this patent is extended or adjusted under 35 U.S.C. 154(b) by 0 days.

(21) Appl. No.: 15/280,942

(22) Filed: Sep. 29, 2016

(30) Foreign Application Priority Data

Jul. 11, 2016 (KR) .................. 10-2016-0087513

(51) Int. Cl.
*H01L 35/10* (2006.01)
*H01L 35/32* (2006.01)
*H01L 35/34* (2006.01)
*H01L 35/04* (2006.01)

(52) U.S. Cl.
CPC .............. *H01L 35/34* (2013.01); *H01L 35/04* (2013.01); *H01L 35/32* (2013.01)

(58) Field of Classification Search
CPC ......................................... H01L 35/00–35/34
See application file for complete search history.

(56) References Cited

U.S. PATENT DOCUMENTS

| | | | |
|---|---|---|---|
| 2,938,357 A | 5/1960 | Sheckler | |
| 3,225,549 A | 12/1965 | Elfving | |
| 6,827,505 B2 | 12/2004 | Shinde et al. | |
| 2003/0012005 A1 | 1/2003 | Ito et al. | |
| 2005/0016183 A1 | 1/2005 | Tateyama et al. | |
| 2005/0211288 A1 | 9/2005 | Tateyama et al. | |
| 2006/0005873 A1* | 1/2006 | Kambe .................. H01L 35/30 136/211 |
| 2006/0042675 A1 | 3/2006 | Tateyama et al. | |
| 2006/0042676 A1 | 3/2006 | Sogou et al. | |
| 2006/0118159 A1 | 6/2006 | Tsuneoka et al. | |
| 2006/0123799 A1 | 6/2006 | Tateyama et al. | |

(Continued)

FOREIGN PATENT DOCUMENTS

| | | |
|---|---|---|
| JP | 3252902 B2 | 2/2002 |
| JP | 2006-049872 A | 2/2006 |
| JP | 5432927 B2 | 3/2014 |

*Primary Examiner* — Zandra Smith
*Assistant Examiner* — Molly Reida
(74) *Attorney, Agent, or Firm* — Morgan, Lewis & Bockius LLP

(57) ABSTRACT

A method for packaging a thermoelectric module may include thermoelectric module accommodation, of accommodating at least one thermoelectric module in a housing having a base and a sidewall, electric wire sealing, of sealing an electric wire of the thermoelectric module with a sealing tube, bonding member interposing, of placing a cover having a top portion and a sidewall on top of the housing and interposing a bonding member between the sidewall of the housing and the sidewall of the cover, and bonding, of bonding the sidewall of the housing and the sidewall of the cover that are hermetically sealed by the bonding member, in which the bonding member may be formed of a resin material.

19 Claims, 16 Drawing Sheets

(56) References Cited

U.S. PATENT DOCUMENTS

2006/0289051 A1* 12/2006 Niimi .................. H01L 35/32
  136/203
2007/0028955 A1   2/2007 Sogou et al.
2007/0256427 A1  11/2007 Tateyama et al.
2010/0101619 A1   4/2010 Sogou et al.
2011/0265838 A1  11/2011 Kambe

* cited by examiner

METHOD FOR PACKAGING THERMOELECTRIC MODULE

CROSS-REFERENCE TO RELATED APPLICATION

The present application claims priority to Korean Patent Application No. 10-2016-0087513, filed Jul. 11, 2016, the entire contents of which is incorporated herein for all purposes by this reference.

BACKGROUND OF THE INVENTION

Field of the Invention

The present invention relates to a method for packaging at least one thermoelectric module and, more particularly, to a method for packaging a thermoelectric module, which can stably protect individual elements of the thermoelectric module such as thermoelectric elements, electrodes, and insulating boards, while maintaining the power generation performance of the thermoelectric module.

Description of Related Art

A thermoelectric module is used in a thermoelectric power generation system utilizing the Seebeck effect in which a difference in temperatures of both surfaces of the thermoelectric module is used to generate an electromotive force.

During the thermoelectric power generation by such a thermoelectric module, the output of the thermoelectric power generation may be increased by maintaining a large temperature difference between the high temperature side and the low temperature side. Here, a heat transfer rate from a heat source to the thermoelectric module may significantly affect the output.

The thermoelectric module includes a plurality of thermoelectric elements (N-type and P-type semiconductors) having opposite polarities and arranged in an alternating manner. The plurality of thermoelectric elements may be electrically connected in series through electrodes thereof, and insulating boards may be attached to respective electrodes.

Meanwhile, when the thermoelectric elements and/or the electrodes of the thermoelectric module come into contact with the outside air under a high temperature environment, they may be oxidized or chemically changed, which may degrade thermoelectric power generation performance.

When moist or conducting liquid (water or the like) contacts the thermoelectric elements and/or the electrodes, it may cause electrical shorting.

In addition, when impacts or shocks may occur due to external physical factors, stress, strain, shear force or the like may cause damages to the thermoelectric module.

In order to protect the thermoelectric module from external chemical and/or physical factors, a technique of packaging the thermoelectric elements, the electrodes, and the like with a metallic housing has been proposed.

In a conventional packaging technique, however, heat transfer may easily occur along sidewalls of the metallic housing, resulting in severe heat loss. Accordingly, it is difficult to secure a temperature difference between the high temperature side and the low temperature side, which may degrade thermoelectric power generation performance.

In addition, when the thermoelectric module is exposed to a heat source for a long time or is subjected to repeated temperature changes, thermal stress or thermal shock may occur due to a difference in thermal expansion coefficients between the thermoelectric elements and the electrodes, resulting in damages to the thermoelectric module and malfunction of the thermoelectric module.

Furthermore, an electric wire connected to the electrode of the thermoelectric module may be sealed through hermetic sealing, which may cause severe leakage current due to insulation resistance. The strain of the electric wire may change the electrode resistance, which may degrade thermoelectric power generation performance.

The information disclosed in this Background of the Invention section is only for enhancement of understanding of the general background of the invention and should not be taken as an acknowledgement or any form of suggestion that this information forms the prior art already known to a person skilled in the art.

BRIEF SUMMARY

Various aspects of the present invention are directed to providing a method for packaging a thermoelectric module, which can effectively prevent an oxidation reaction, chemical changes, and the like that may be caused by external factors, avoid electrical shorting that may be caused by moist, conducting liquid, or the like, and protect individual elements of the thermoelectric module from stress, strain, shear force, and the like, due to external physical factors.

According to various aspects of the present invention, a method for packaging a thermoelectric module may include thermoelectric module accommodation, of accommodating at least one thermoelectric module in a housing having a base and a sidewall, electric wire sealing, of sealing an electric wire of the thermoelectric module with a sealing tube, bonding member interposing, of placing a cover having a top portion and a sidewall on top of the housing and interposing a bonding member between the sidewall of the housing and the sidewall of the cover, and bonding, of bonding the sidewall of the housing and the sidewall of the cover that are hermetically sealed by the bonding member, in which the bonding member may be a resin material.

The bonding member interposing may include passing the sealing tube through a portion of the bonding member.

The bonding member interposing may include inserting a first portion of the bonding member into a top of the sidewall of the housing and inserting a second portion of the bonding member into a bottom of the sidewall of the cover.

The bonding may include applying heat to the bonding member in a vacuum or inert atmosphere for the bonding member to be melted and cured between a top of the sidewall of the housing and a bottom of the sidewall of the cover to hermetically seal the top of the sidewall of the housing and the bottom of the sidewall of the cover.

The sealing tube may be a heat shrinkable tube, and the electric wire may be sealed by applying heat to the heat shrinkable tube.

The bonding member may be a heat shrinkable film.

The method may further include forming a thermal resistance increasing part in at least one of the sidewall of the housing and the sidewall of the cover, before the thermoelectric module accommodation or after the bonding.

A portion of the sidewall of the housing may be pressurized to form a thin wall portion that is thinner than the sidewall of the housing, before the thermoelectric module accommodation.

A portion of the sidewall of the housing may be processed to form a non-straight portion, before the thermoelectric module accommodation or after the bonding.

According to various aspects of the present invention, a method for packaging a thermoelectric module may include thermoelectric module accommodation, of accommodating at least one thermoelectric module in a housing having a base and a sidewall, tube installation, of providing a tube having an inner diameter greater than an outer diameter of an electric wire of the thermoelectric module on a periphery of the electric wire to form a gap between the electric wire and the tube, bonding member interposing, of placing a cover having a top portion and a sidewall on top of the housing and interposing a bonding member between the sidewall of the housing and the sidewall of the cover, bonding, of bonding the sidewall of the housing and the sidewall of the cover that are hermetically sealed by the bonding member, vacuumizing, of vacuumizing an internal space of the housing and the cover through the gap between the electric wire and the tube, and tube sealing, of sealing the tube after the vacuumizing, in which the bonding member may be formed of a resin material.

The vacuumizing may include injecting an inert gas through the gap between the electric wire and the tube.

A heat resistant cap may be provided on an outer end portion of the tube, between the bonding member interposing and the bonding.

The tube sealing may include providing a sealing cap on an outer end portion of the tube and applying heat thereto to seal the outer end portion of the tube through melting and curing of the sealing cap.

A top of the sidewall of the housing and a bottom of the sidewall of the housing may be provided with first and second fitting parts, respectively, to which the bonding member is fitted. By applying heat to the bonding member, the bonding member may be melted and cured between the first and second fitting parts to hermetically seal the first and second fitting parts.

Each of the first and second fitting parts may include a horizontal portion extending in a horizontal direction and a bent portion bent with respect to the horizontal portion at a predetermined angle.

The first and second fitting parts may be disposed to be adjacent to the inside of the sidewall of the housing and the inside of the sidewall of the cover.

The first and second fitting parts may be disposed in opposite positions in relation to the sidewall of the housing and the sidewall of the cover.

It is understood that the term "vehicle" or "vehicular" or other similar terms as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g., fuel derived from resources other than petroleum). As referred to herein, a hybrid vehicle is a vehicle that has two or more sources of power, for example, both gasoline-powered and electric-powered vehicles.

The methods and apparatuses of the present invention have other features and advantages which will be apparent from or are set forth in more detail in the accompanying drawings, which are incorporated herein, and the following Detailed Description, which together serve to explain certain principles of the present invention.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

DETAILED DESCRIPTION

Reference will now be made in detail to various embodiments of the present invention(s), examples of which are illustrated in the accompanying drawings and described below. While the invention(s) will be described in conjunction with exemplary embodiments, it will be understood that the present description is not intended to limit the invention(s) to those exemplary embodiments. On the contrary, the invention(s) is/are intended to cover not only the exemplary embodiments, but also various alternatives, modifications, equivalents and other embodiments, which may be included within the spirit and scope of the invention as defined by the appended claims.

Figure 6:
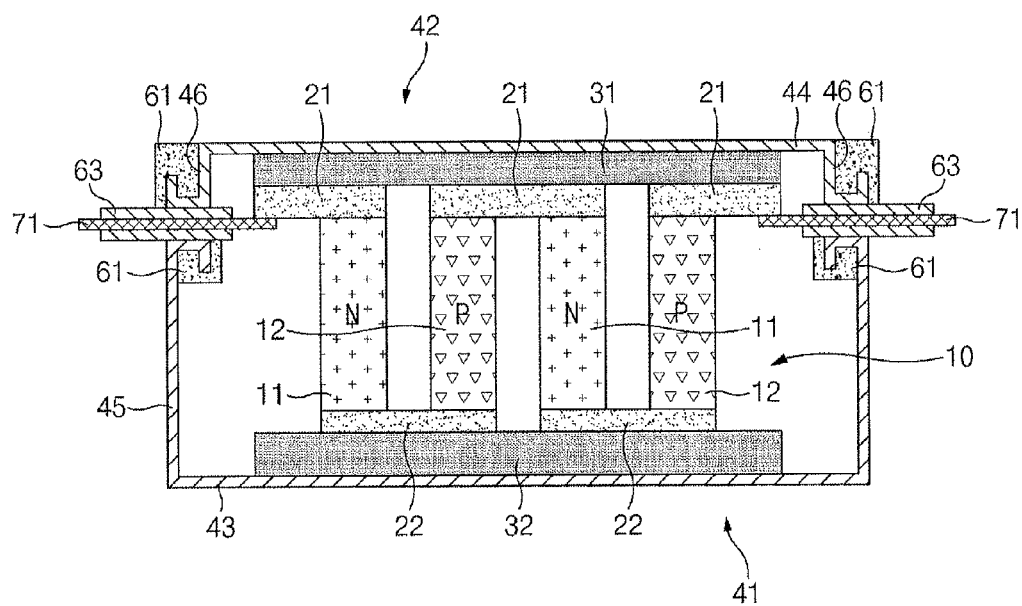
FIG. 6 illustrates a state in which a thermoelectric module is packaged by a housing, using a method for packaging a thermoelectric module, according to various embodiments of the present invention.

According to various embodiments of the present invention, a method for packaging a thermoelectric module may be implemented by packaging at least one thermoelectric module 10 in a housing 41 and a cover 42 as illustrated in FIG. 6. At least one thermoelectric module 10 may be stably protected by the housing 41 and the cover 42 that are bonded and hermetically sealed using the bonding member 61.

Figure 2:
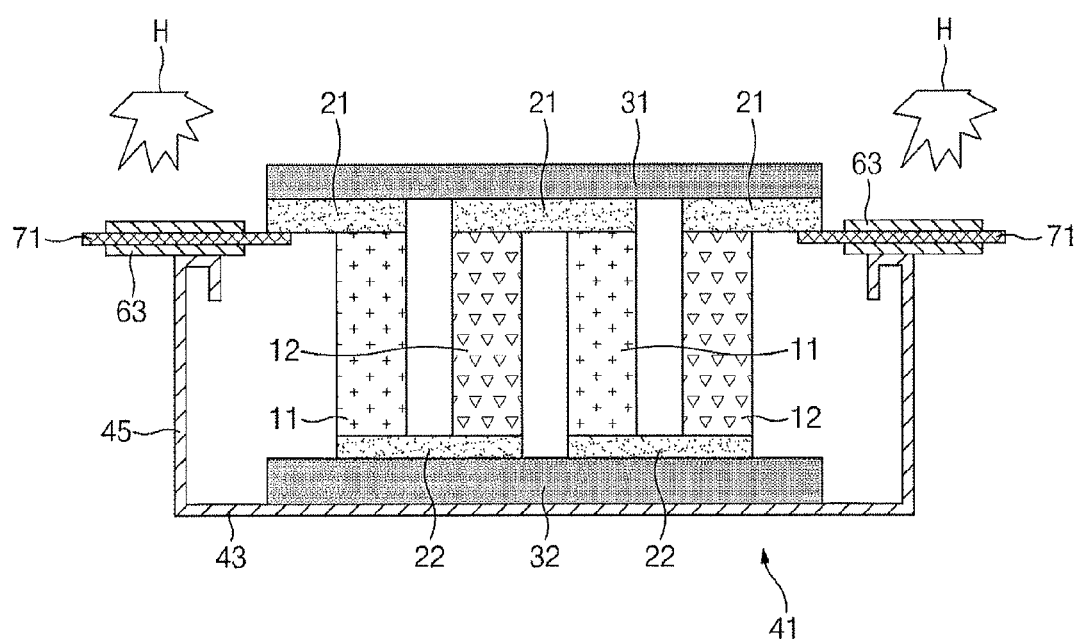
FIG. 2 illustrates a thermoelectric module accommodation step and an electric wire sealing step in a method for packaging a thermoelectric module, according to various embodiments of the present invention.

As illustrated in FIG. 2, the thermoelectric module 10 includes one or more first thermoelectric elements 11 and one or more second thermoelectric elements 12 that are arranged in an alternating manner, and a plurality of electrodes 21 and 22 electrically connecting the first and second thermoelectric elements 11 and 12 in series.

The first and second thermoelectric elements 11 and 12 that are semiconductors having opposite polarities may be paired while alternating with each other. Adjacent first and second thermoelectric elements 11 and 12 may form a semiconductor pair. For example, when the first thermoelectric element 11 is an N-type semiconductor, the second thermoelectric element 12 is a P-type semiconductor. On the contrary, when the first thermoelectric element 11 is a P-type semiconductor, the second thermoelectric element 12 is an N-type semiconductor.

As illustrated in FIG. 2, the plurality of electrodes 21 and 22 include at least one first electrode 21 connecting the top of the first thermoelectric element 11 to the top of the second thermoelectric element 12, and at least one second electrode 22 connecting the bottom of the first thermoelectric element 11 to the bottom of the second thermoelectric element 12. The first and second electrodes 21 and 22 may be disposed on the tops and bottoms of the first and second thermoelectric elements 11 and 12 in a zigzag arrangement, thereby electrically connecting the first and second thermoelectric elements 11 and 12 in series.

The thermoelectric module 10 according to various embodiments of the present invention further includes a first insulating board 31 provided with respect to one or more first electrodes 21, and a second insulating board 32 provided with respect to one or more second electrodes 22.

The plurality of first electrodes 21 and the plurality of second electrodes 22 may be provided on facing surfaces of the first insulating board 31 and the second insulating board 32, respectively.

As illustrated in FIG. 2, the plurality of first electrodes 21 may be formed to be integrated on a bottom surface of the first insulating board 31 through a patterning process or the like. Alternatively, the plurality of first electrodes 21 may be attached to the bottom surface of the first insulating board 31 through an adhesive or soldering.

As illustrated in FIG. 2, the plurality of second electrodes 22 may be formed to be integrated on a top surface of the second insulating board 32 through a patterning process or the like. Alternatively, the plurality of second electrodes 22 may be attached to the top surface of the second insulating board 32 through an adhesive or soldering.

The first insulating board 31 and the second insulating board 32 may be spaced apart from each other in a vertical direction, such that the first and second thermoelectric elements 11 and 12 having opposite polarities may be arranged to alternate with each other in a horizontal direction between the first insulating board 31 and the second insulating board 32. By arranging the plurality of thermoelectric elements 11 and the plurality of second thermoelectric elements 12 in an alternating manner between the first insulating board 31 and the second insulating board 32, the plurality of paired semiconductors may be disposed between the first insulating board 31 and the second insulating board 32.

Meanwhile, the first insulating board 31 and the second insulating board 32 may form a low temperature part and a high temperature part, respectively, in order to make an appropriate temperature difference. For example, a cooling unit may be integrally provided in the inside of the first insulating board 31 or may be attached to an external surface of the first insulating board 31, such that the first insulating board 31 may be configured as the lower temperature part (a heat dissipation part), and a heat source may be integrated with the second insulating board 32 or may be attached to the second insulating board 32, such that the second insulating board 32 may be configured as the high temperature part (a heat absorption part). On the contrary, a heat source may be provided with the first insulating board 31, such that the first insulating board 31 may be configured as the high temperature part (the heat absorption part); and a cooling unit may be provided with the second insulating board 32, such that the second insulating board 32 may be configured as the lower temperature part (the heat dissipation part).

An electric wire or a lead may be connected to the first electrode 21 or the second electrode 22 of the thermoelectric module 10. The electric wire or the lead may be led to the outside of the housing 41 and the cover 42 to output electrical energy generated by the thermoelectric elements 11 and 12 and the electrodes 21 and 22 externally. Hereinafter, the electric wire or the lead for outputting electrical energy will be referred to as the "electric wire 71", and the electric wire 71 described herein includes all types of output units for outputting the electrical energy generated by the thermoelectric elements 11 and 12 and the electrodes 21 and 22 externally. For example, the electric wire 71 of the thermoelectric module 10 may be connected to the first electrode 21 to be led to the outside of the housing 41 and the cover 42.

Figure 1:
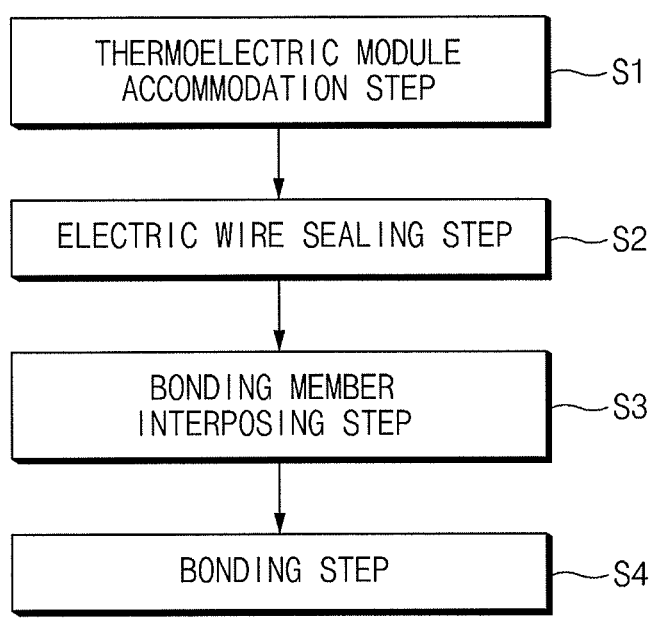
FIG. 1 illustrates a flowchart of a method for packaging a thermoelectric module, according to various embodiments of the present invention.

FIG. 1 illustrates a flowchart of a method for packaging a thermoelectric module, according to various embodiments of the present invention. In various embodiments, the method for packaging a thermoelectric module includes a thermoelectric module accommodation step S1 for accommodating at least one thermoelectric module 10 in the housing 41, an electric wire sealing step S2 for sealing the electric wire 71 of the thermoelectric module 10 with a sealing tube 63, a bonding member interposing step S3 for placing the cover 42 on the top of the housing 41 and interposing the bonding member 61 between a sidewall 45 of the housing 41 and a sidewall 46 of the cover 42, and a bonding step S4 for bonding the bonding member 61 to the sidewall 45 of the housing 41 and the sidewall 46 of the cover 42.

Thermoelectric Module Accommodation Step (S1)

As illustrated in FIG. 2, the housing 41 includes a base 43 supporting a bottom surface of the second insulating board 32 of the thermoelectric module 10, and the sidewall 45 provided on edges of the base 43. The sidewall 45 may extend along the edges of the base 43.

At least one thermoelectric module 10 may be accommodated in the inside of the housing 41 in step S1. The base 43 of the housing 41 may support the bottom surface of the second insulating board 32 of the thermoelectric module 10, and the sidewall 45 of the housing 41 may envelop the second insulating board 32 of the thermoelectric module 10 and parts adjacent to the second insulating board 32.

The housing 41 may be formed of a material having high thermal resistance and high rigidity so as to protect the thermoelectric elements 11 and 12, the electrodes 21 and 22, and the insulating boards 31 and 32 of the thermoelectric module 10. For example, the housing 41 may be formed of a metal such as stainless or a base metal such as ceramic.

Electric Wire Sealing Step (S2)

As illustrated in FIG. 2, the sealing tube 63 may be provided to seal the electric wire 71 of the thermoelectric module 10 in step S2.

The sealing tube 63 may be formed of an insulating resin material. By allowing the sealing tube 63 to be hermetically attached to the periphery of the electric wire 71, sealability and insulating properties with respect to the electric wire 71 may be secured.

According to various embodiments, the sealing tube 63 may be a heat shrinkable tube. As illustrated in FIG. 2, by applying heat H to an external surface of the sealing tube 63, the sealing tube 63, which is a heat shrinkable tube, may be thermally shrunk and attached to an external surface of the electric wire 71, thereby securing sealability and insulating properties with respect to the electric wire 71.

Meanwhile, the sealing tube 63 may be extended in a direction perpendicular to the sidewall 45 of the housing 41, i.e., in a horizontal direction, such that the electric wire 71 sealed by the sealing tube 63 may conveniently be provided in the horizontal direction. By allowing the electric wire 71 to pass through the sealing tube 63 and be led out in the horizontal direction, the insulation resistance of the electric wire 71 may be minimized, whereby leakage may be prevented during the thermoelectric power generation, and the strain of the electric wire 71 may be prevented such that variations in resistance of the electrodes 21 and 22 may be minimized.

Bonding Member Interposing Step (S3)

Figure 3:
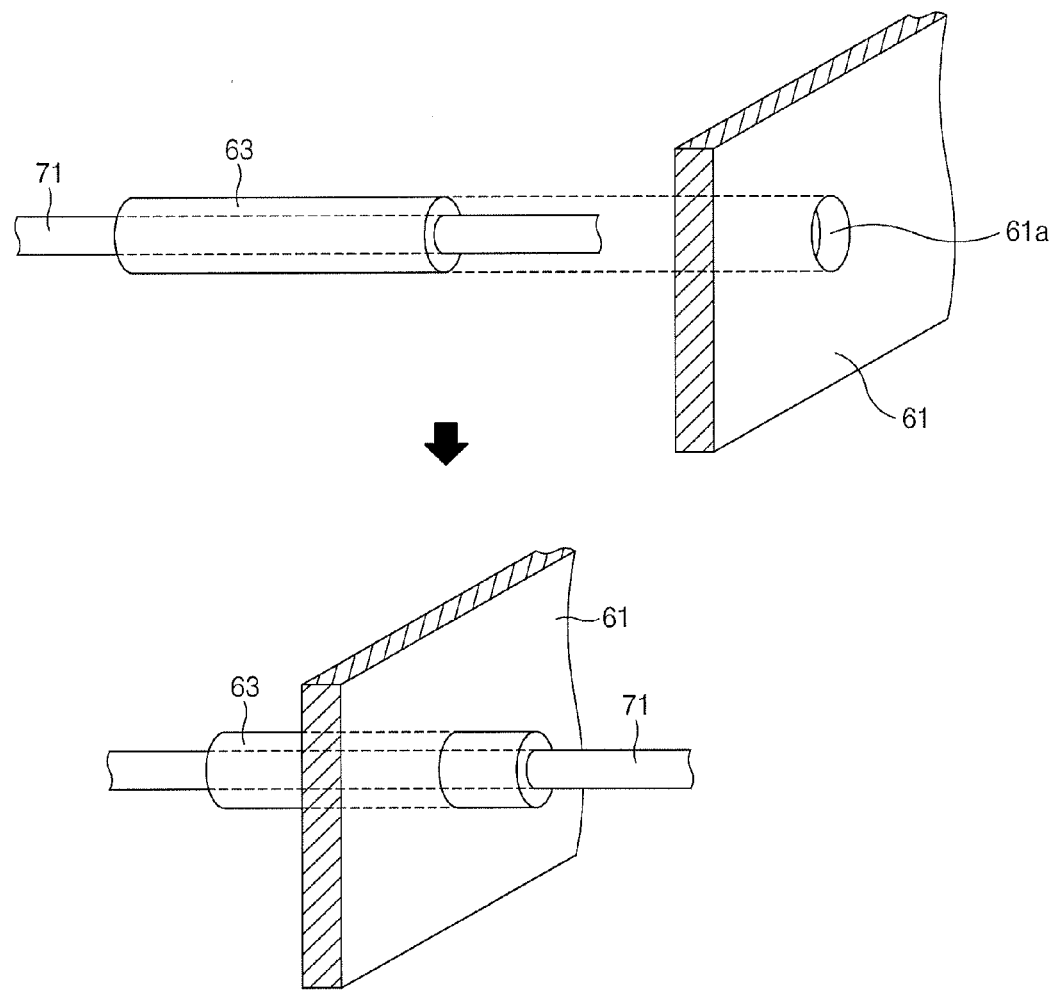
FIG. 3 illustrates a step for allowing a sealing tube to pass through a bonding member in a method for packaging a thermoelectric module, according to various embodiments of the present invention.
Figure 4:
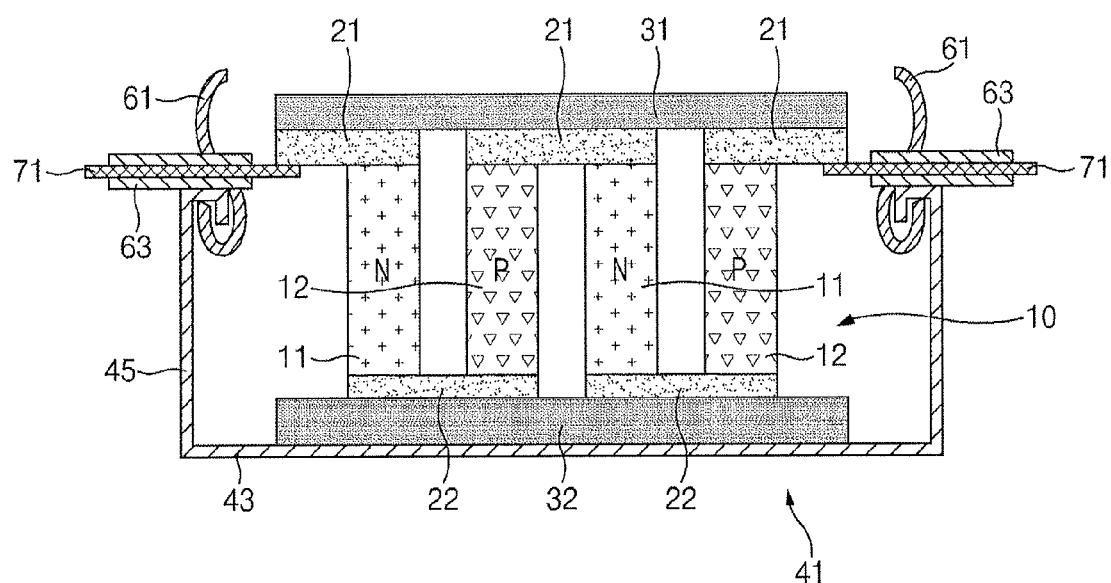
FIG. 4 illustrates a bonding member interposing step in a method for packaging a thermoelectric module, according to various embodiments of the present invention.

After the electric wire 71 of the thermoelectric module 10 is sealed by the sealing tube 63, the sealing tube 63 may pass through a through hole 61a of the bonding member 61 as illustrated in FIG. 3, and then, a portion 61c (a bottom portion) of the bonding member 61 may be inserted into the top of the sidewall 45 of the housing 41 as illustrated in FIG. 4.

Figure 5:
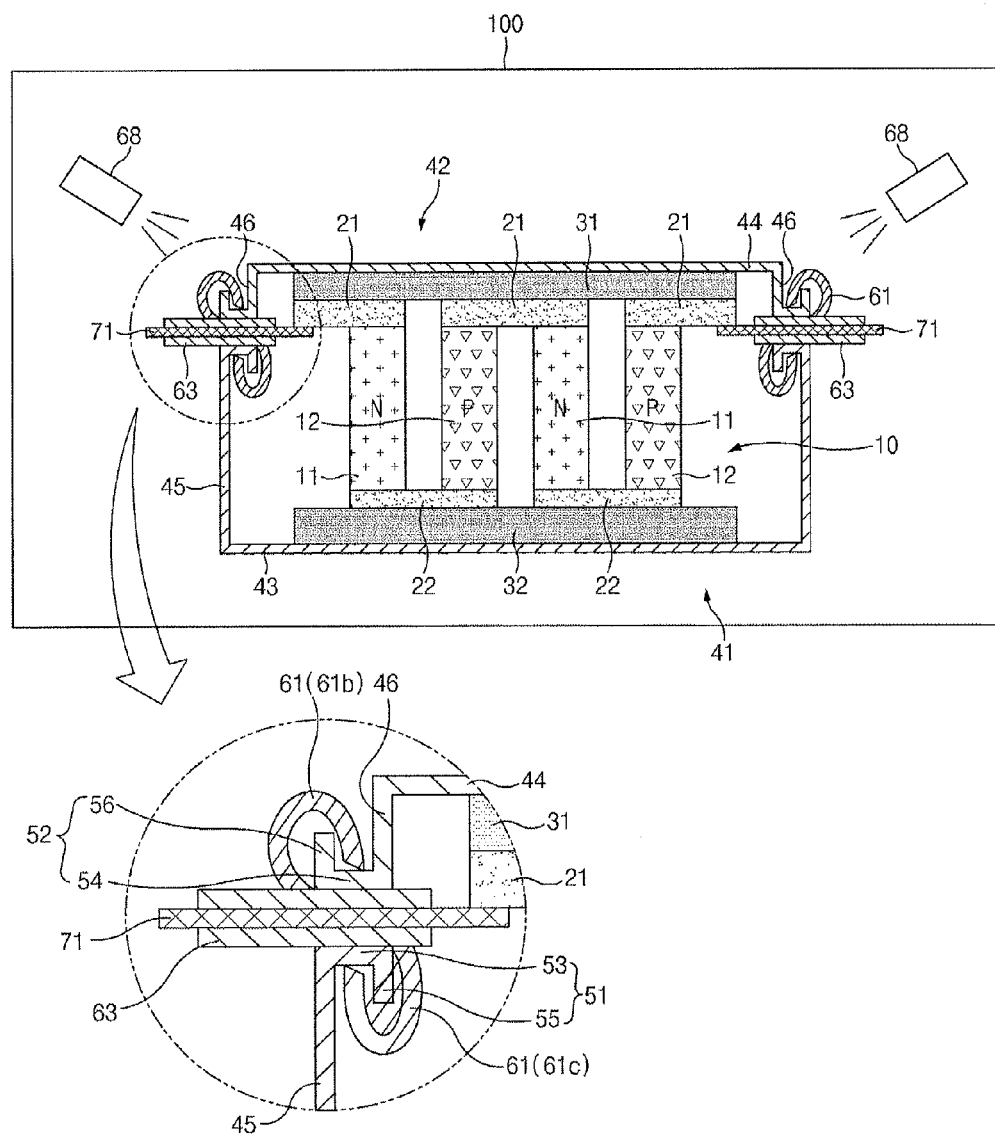
FIG. 5 illustrates a bonding step in a method for packaging a thermoelectric module, according to various embodiments of the present invention.

Then, the housing 41 in which the thermoelectric module 10 is accommodated may be positioned within a vacuum chamber 100 or a chamber filled with inert gas as illustrated in FIG. 5. After the cover 42 is positioned on the top of the housing 41, a portion 61b (a top portion) of the bonding member 61 may be inserted into the bottom of the sidewall 46 of the cover 42, and thus, the bonding member 61 may be interposed between the top of the sidewall 45 of the housing 41 and the bottom of the sidewall 46 of the cover 42 in step S3.

The housing 41 and the cover 42 in which at least one thermoelectric module 10 is accommodated may be placed within the vacuum chamber 100 such that an internal space of the housing 41 and the cover 42 may be vacuumized. Thus, when the thermoelectric module 10 is packaged by the housing 41 and the cover 42, sealability and insulating properties may be significantly improved.

As illustrated in FIG. 5, the cover 42 includes a top portion 44 supporting a top surface of the first insulating board 31 of the thermoelectric module 10, and the sidewall 46 provided on edges of the top portion 44. The sidewall 46 may extend along the edges of the top portion 44. By allowing the sidewall 46 of the cover 42 and the sidewall 45 of the housing 41 to correspond to each other, the cover 42 may be placed on the top of the housing 41. The cover 42 may envelop the first insulating board 31 of the thermoelectric module 10 and parts adjacent to the first insulating board 31.

The cover 42 may be formed of a material having high thermal resistance and high rigidity so as to protect the thermoelectric elements 11 and 12, the electrodes 21 and 22, and the insulating boards 31 and 32 of the thermoelectric module 10. For example, the cover 42 may be formed of a metal such as stainless or a base metal such as ceramic.

The bonding member 61 may be formed of a film or sheet made of a material capable of being melted by heat. For example, the bonding member 61 may be formed of a resin material capable of being melted by heat such that it may hermetically seal the housing 41 and the cover 42.

According to various embodiments, the bonding member 61 may be formed of a heat shrinkable film or a heat shrinkable sheet.

According to various embodiments, fitting parts 51 and 52 may be provided with the sidewall 45 of the housing 41 and the sidewall 46 of the cover 42, respectively, and the bonding member 61 may be bonded to the fitting parts 51 and 52. By allowing the bonding member 61 to be bonded to the fitting parts 51 and 52, the sealability and bonding properties of the housing 41 and the cover 42 through the bonding member 61 may be further stabilized and secured.

The fitting parts 51 and 52 include a first fitting part 51 provided at the top of the sidewall 45 of the housing 41, and a second fitting part 52 provided at the bottom of the sidewall 46 of the cover 42.

The first fitting part 51 includes a first horizontal portion 53 extending from the top of the sidewall 45 of the housing 41 in a horizontal direction, and a first bent portion 55 bent from an end of the first horizontal portion 53 at a predetermined angle.

The first horizontal portion 53 may be extended from the sidewall 45 of the housing 41 toward the internal space of the housing 41 in the horizontal direction.

FIG. 5 illustrates the first bent portion 55 being bent at approximately 90 degrees with respect to the first horizontal portion 53 by way of example. However, the first bent portion 55 may be bent at an angle smaller than 90 degrees or at an angle larger than 90 degrees. Corners of the first horizontal portion 53 and the first bent portion 55 may be rounded, such that the bottom of the bonding member 61 may conveniently be fitted to the first fitting part 51

The second fitting part 52 includes a second horizontal portion 54 extending from the bottom of the sidewall 46 of the cover 42 in a horizontal direction, and a second bent portion 56 bent from an end of the second horizontal portion 54 at a predetermined angle.

The second horizontal portion 54 may be extended from the sidewall 46 of the cover 42 toward the outside of the cover 42 in the horizontal direction.

FIG. 5 illustrates the second bent portion 56 being bent at approximately 90 degrees with respect to the second horizontal portion 54 by way of example. However, the second bent portion 56 may be bent at an angle smaller than 90 degrees or at an angle larger than 90 degrees. Corners of the second horizontal portion 54 and the second bent portion 56 may be rounded, such that the top of the bonding member 61 may conveniently be fitted to the second fitting part 52.

The first fitting part 51 and the second fitting part 52 may be formed in opposite positions in relation to the sidewall 45 of the housing 41 and the sidewall 46 of the cover 42. Accordingly, the bonding member 61 may be conveniently inserted into the first and second fitting parts 51 and 52, and the first and second fitting parts 51 and 52 may be hermetically sealed by the bonding member 61, whereby a stable sealing bonding structure may be effectively obtained.

As illustrated in FIG. 5, the first horizontal portion 53 and the first bent portion 55 of the first fitting part 51 may be disposed inwardly of the sidewall 45 of the housing 41, and the second horizontal portion 54 and the second bent portion 56 of the second fitting part 52 may be disposed outwardly of the sidewall 46 of the cover 42. However, the directions of the first and second fitting parts are not limited thereto. Alternatively, the first horizontal portion 53 and the first bent portion 55 of the first fitting part 51 may be disposed outwardly of the sidewall 45 of the housing 41, and the second horizontal portion 54 and the second bent portion 56 of the second fitting part 52 may be disposed inwardly of the sidewall 46 of the cover 42.

Alternatively, the first horizontal portion 53 and the first bent portion 55 of the first fitting part 51 may be disposed inwardly of the sidewall 45 of the housing 41 and the second horizontal portion 54 and the second bent portion 56 of the second fitting part 52 may be disposed inwardly of the sidewall 46 of the cover 42, and thus, when heat is applied to the bonding member 61 formed of the heat shrinkable tube, the overheat of the bonding member 61 may be prevented and stable thermal shrinkage of the bonding member 61 may be induced. In addition, the bonding member 61 may be positioned in the internal space of the housing 41 and the cover 42, such that it may be concealed from the outside, and thus, damage possibilities thereof may be minimized.

Bonding Step (S4)

As illustrated in FIG. 5, after the housing 41 and the cover 42 in which at least one thermoelectric module 10 is accommodated may be placed within the vacuum chamber 100 or the chamber filled with the inert gas, heat may be applied to the bonding member 61 interposed between the sidewall 45 of the housing 41 and the sidewall 46 of the cover 42 by a heat application unit 68 such as an electron-beam or a laser, and thus, the bonding member 61 may be melted onto the first fitting part 51 of the housing 41 and the second fitting part 52 of the cover 42 and be then cured. Through the melting and curing of the bonding member 61, the sidewall 45 of the housing 41 and the sidewall 46 of the cover 42 may be firmly bonded to each other and be hermetically sealed.

The sidewall 45 of the housing 41 and the sidewall 46 of the cover 42 may be bonded to each other by applying the heat to the bonding member 61 within the vacuum chamber 100 or the chamber filled with the inert gas, whereby the sealability and insulating properties through the housing 41 and the cover 42 may be significantly improved.

In particular, when the heat is applied to the bonding member 61 that is formed of a heat shrinkable film or a heat shrinkable sheet and, the bonding member 61 may be thermally shrunk and attached to the first fitting part 51 of the housing 41 and the second fitting part 52 of the cover 42. The sidewall 45 of the housing 41 and the sidewall 46 of the cover 42 may be firmly bonded by thermal shrinkage of the bonding member 61 and be hermetically sealed.

As stated above, since the sidewall 45 of the housing 41 and the sidewall 46 of the cover 42 are hermetically bonded by the bonding member 61, at least one thermoelectric module 10 may be hermetically packaged by the housing 41 and the cover 42 as illustrated in FIG. 6. Thus, the sidewall 45 of the housing 41 and the sidewall 46 of the cover 42 may be firmly bonded and be hermetically sealed.

In addition, the bonding member 61 may be bonded to the sidewall 45 of the housing 41 and the sidewall 46 of the cover 42 in a state of being interposed therebetween, thereby preventing or reducing the flow of heat transferred through the sidewall 45 of the housing 41 and the sidewall 46 of the cover 42.

In particular, the bonding member 61 may be formed of a material having thermal conductivity lower than that of the housing 41 and the cover 42. For example, the bonding member 61 may be formed of a material having low thermal conductivity such as resin such that it may prevent or reduce the flow of heat transferred through the sidewall 45 of the housing 41 and the sidewall 46 of the cover 42 formed of a metallic material.

According to various embodiments, the sealing tube 63 may pass through the bonding member 61 such that the electric wire 71 may pass through side surfaces of the housing 41 and the cover 42 to be provided in the horizontal direction. Accordingly, electrical connections with respect to adjacent electrical components may easily be made, and a lead-out length of the electric wire 71 in the sealing tube 63 may be optimized such that insulation resistance may be minimized. Therefore, leakage may be prevented during the thermoelectric power generation, and the strain of the electric wire 71 may be prevented such that variations in resistance of the electrodes 21 and 22 may be minimized.

Meanwhile, the bonding member 61 may be disposed to be adjacent to the low temperature part so as to effectively prevent strain due to heat of the high temperature part and prevent dielectric breakdown or shorting of the electric wire 71.

According to various embodiments, when the first insulating board 31 and the first electrode 21 are configured to form the low temperature part, the bonding member 61 may be disposed to be adjacent to the first insulating board 31 and the first electrode 21. To this end, as illustrated in FIG. 6, the sidewall 46 of the cover 42 may be shorter than the sidewall 45 of the housing 41, and thus, the bonding member 61 may be disposed to be adjacent to the first electrode 21 and the first insulating board 31 forming the low temperature part.

Alternatively, according to various embodiments, when the second insulating board 32 and the second electrode 22 are configured to form the low temperature part, the bonding member 61 may be disposed to be adjacent to the second insulating board 32 and the second electrode 22. To this end, the sidewall 45 of the housing 41 may be shorter than the sidewall 46 of the cover 42, and thus, the bonding member 61 may be disposed to be adjacent to the second electrode 22 and the second insulating board 32 forming the low temperature part.

According to various embodiments, the bonding member 61 may be formed to have a shape corresponding to the aforementioned structure of the first and second fitting parts 51 and 52, and the bonding member 61 may be forcibly fitted to the first and second fitting parts 51 and 52. Thus, the bonding force and sealability of the housing 41 and the cover 42 through the bonding member 61 may be stably secured, and the assembly of the housing 41 and the cover 42 may be convenient and easy.

Figure 7:
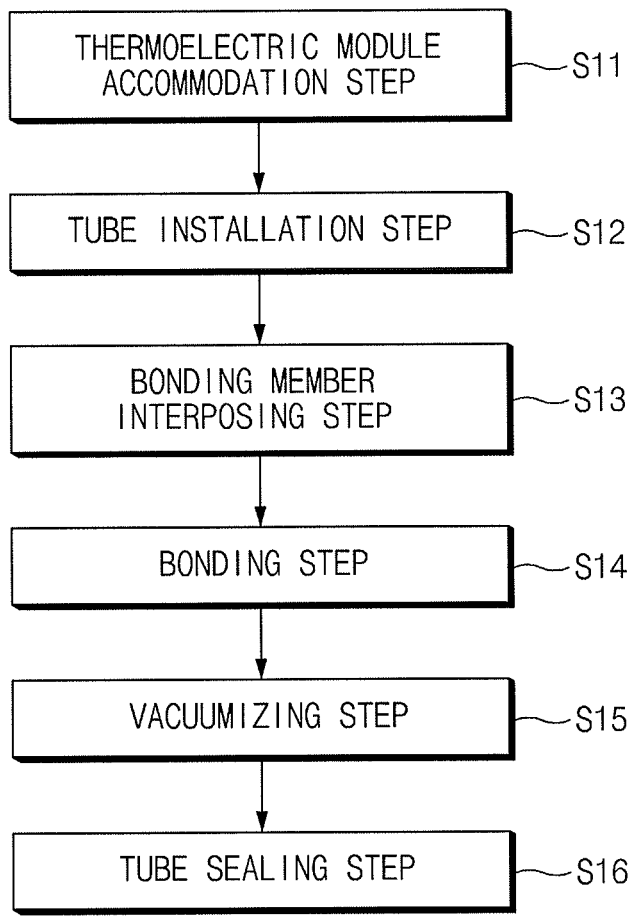
FIG. 7 illustrates a flowchart of a method for packaging a thermoelectric module, according to various embodiments of the present invention.

FIG. 7 illustrates a flowchart of a method for packaging a thermoelectric module, according to various embodiments of the present invention. In the various embodiments of FIG. 7, the method for packaging a thermoelectric module includes a thermoelectric module accommodation step S11 for accommodating at least one thermoelectric module 10 in the housing 41, a tube installation step S12 for providing a tube 64 on the periphery of the electric wire 71 of the thermoelectric module 10, a bonding member interposing step S13 for placing the cover 42 on the top of the housing 41 and interposing the bonding member 61 between the sidewall 45 of the housing 41 and the sidewall 46 of the cover 42, a bonding step S14 for bonding the bonding member 61 to the sidewall 45 of the housing 41 and the sidewall 46 of the cover 42, a vacuumizing step S15 for vacuumizing the internal space of the housing 41 and the cover 42 through the tube 64, and a sealing step S16 for sealing the tube 64.

Thermoelectric Module Accommodation Step (S11)

Figure 8:
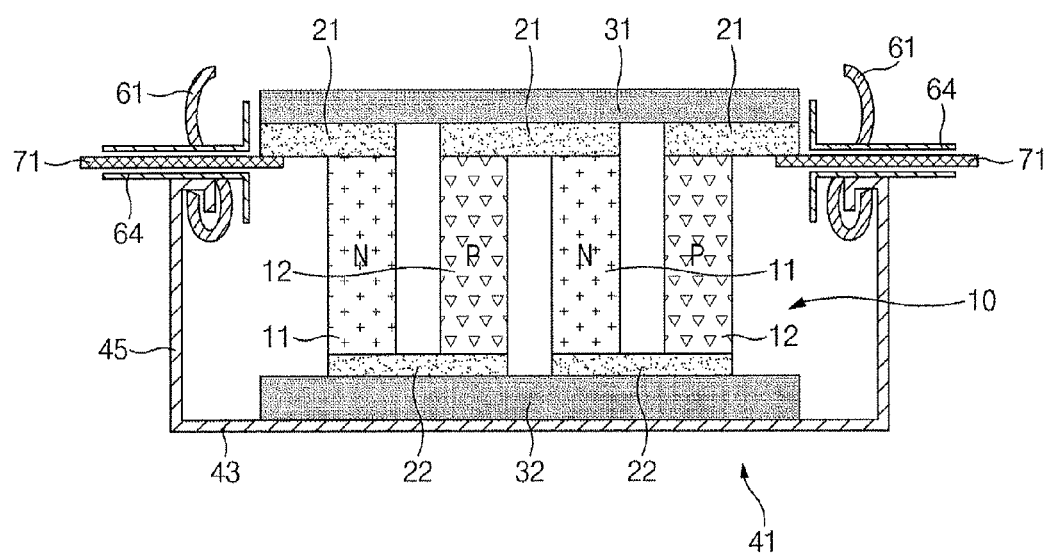
FIG. 8 illustrates a thermoelectric module accommodation step and a tube installation step in a method for packaging a thermoelectric module, according to various embodiments of the present invention.

As illustrated in FIG. 8, at least one thermoelectric module 10 may be accommodated in the inside of the housing 41 in step S11.

Tube Installation Step (S12)

As illustrated in FIG. 8, the tube 64 may be provided on the periphery of the electric wire 71 of the thermoelectric module 10 in step S12.

The tube 64 may be formed of an insulating material such as resin. An inner diameter of the tube 64 may be larger than an outer diameter of the electric wire 71. When the electric wire 71 is inserted into the inside of the tube 64, a gap 64a may be formed between an internal surface of the tube 64 and an external surface of the electric wire 71. An inert gas may be injected into the inside of the housing 41 and the cover 42 or air within the housing 41 and the cover 42 may be discharged externally through the gap 64a between the tube 64 and the electric wire 71, thereby vacuumizing the internal space of the housing 41 and the cover 42.

Bonding Member Interposing Step (S13)

After the tube 64 is provided to enclose the electric wire 71 of the thermoelectric module 10, the tube 64 may pass through the bonding member 61 as illustrated in FIG. 8, and then, the portion 61c (the bottom portion) of the bonding member 61 may be inserted into the top of the sidewall 45 of the housing 41.

Figure 9:
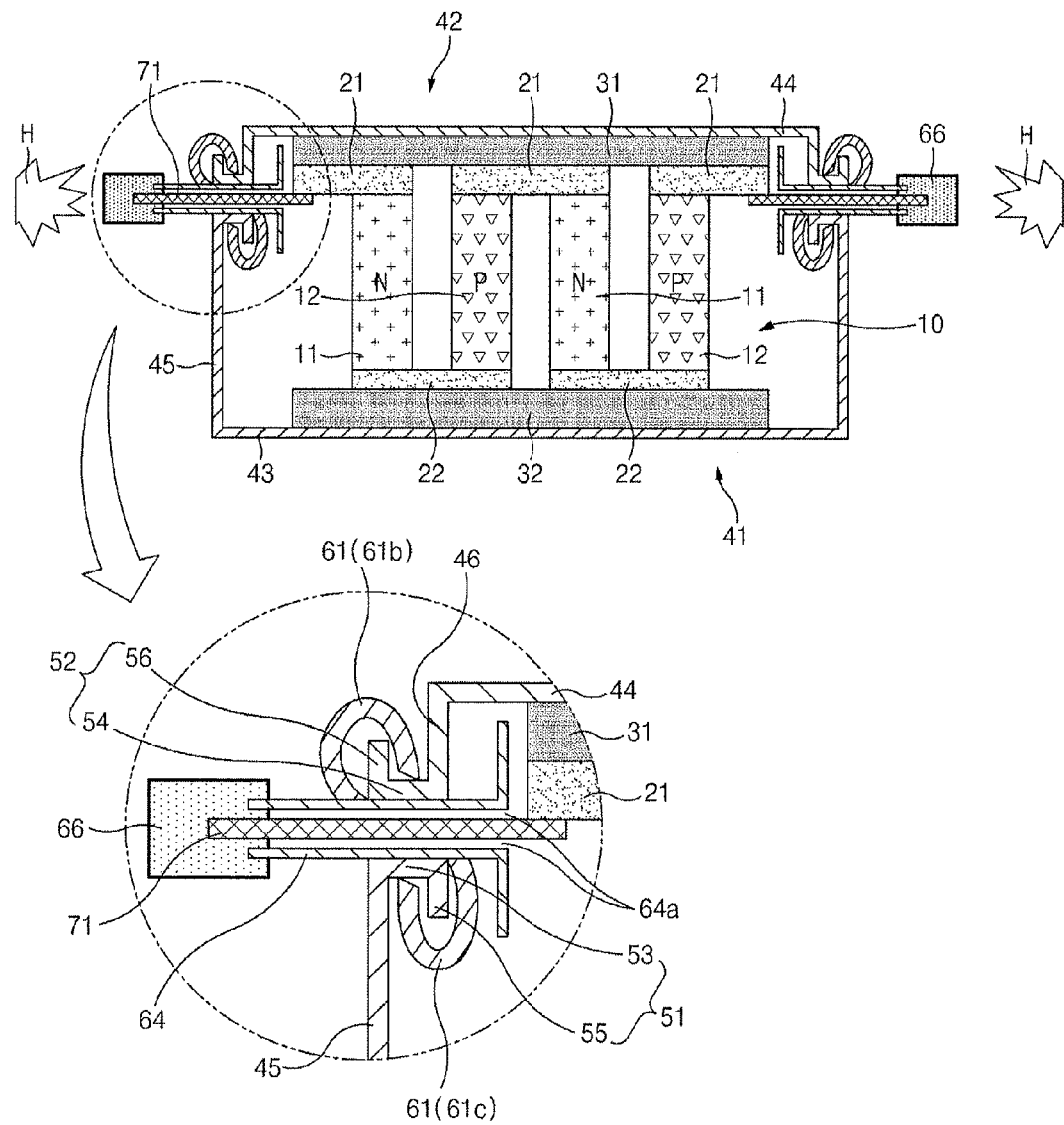
FIG. 9 illustrates a bonding member interposing step and a bonding step in a method for packaging a thermoelectric module, according to various embodiments of the present invention.

As illustrated in FIG. 9, after the cover 42 is positioned on the top of the housing 41, the portion 61b (the top portion) of the bonding member 61 may be inserted into the bottom of the sidewall 46 of the cover 42, and thus, the bonding member 61 may be interposed between the top of the sidewall 45 of the housing 41 and the bottom of the sidewall 46 of the cover 42 in step S13.

Bonding Step (S14)

As illustrated in FIG. 9, after a heat resistant cap 66 is provided on an outer end portion of the tube 64, heat H may be applied to the bonding member 61 interposed between the sidewall 45 of the housing 41 and the sidewall 46 of the cover 42, and thus, the bonding member 61 may be melted (or thermally shrunk) onto the first fitting part 51 of the housing 41 and the second fitting part 52 of the cover 42 and be then cured. The sidewall 45 of the housing 41 and the sidewall 46 of the cover 42 may be firmly combined through the melting (thermal shrinkage) and curing of the bonding member 61 and be hermetically sealed in step S14.

Here, the heat resistant cap 66 may be formed of a material having high thermal resistance, thereby preventing the tube 64 from being melted by heat.

According to other exemplary embodiments, the bonding member 61 may be formed to have a shape corresponding to the aforementioned structure of the first and second fitting parts 51 and 52, and the bonding member 61 may be forcibly fitted to the first and second fitting parts 51 and 52. Thus, the bonding force and sealability of the housing 41 and the cover 42 through the bonding member 61 may be stably secured, and the assembly of the housing 41 and the cover 42 may be convenient and easy.

Vacuumizing Step (S15)

Figure 10:
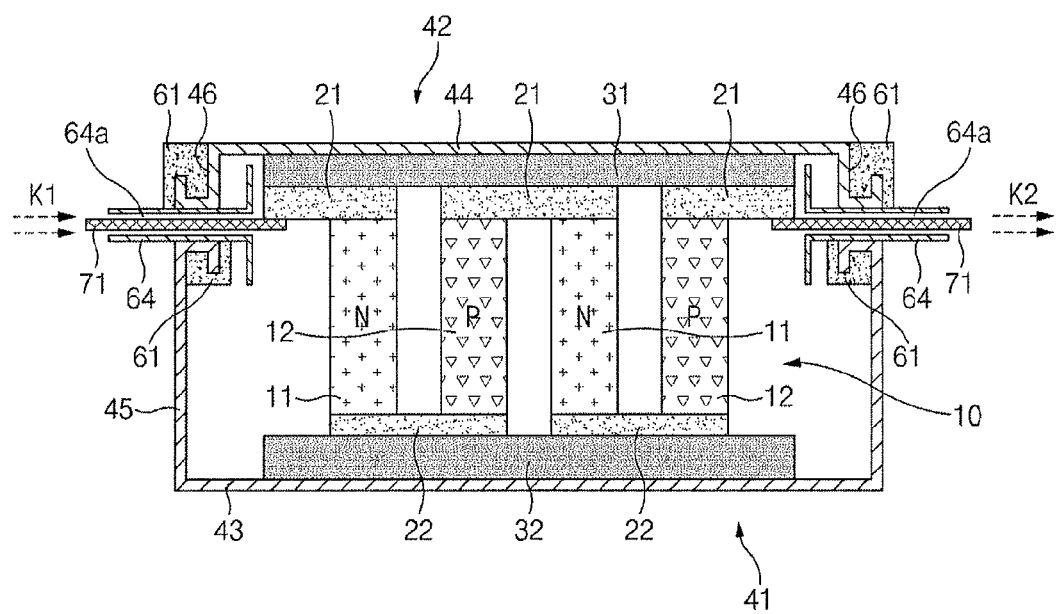
FIG. 10 illustrates a vacuumizing step in a method for packaging a thermoelectric module, according to various embodiments of the present invention.

As illustrated in FIG. 10, after the heat resistant cap 66 is separated from the outer end portion of the tube 64, the inert gas may be injected to the inside of the housing 41 and the cover 42 through the gap 64a between the tube 64 and the electric wire 71 disposed in one side of the housing (see a K1 direction indicated by arrows in FIG. 10), and the air within the housing 41 and the cover 42 may be discharged through the gap 64a between the tube 64 and the electric wire 71 disposed in the other side of the housing (see a K2 direction indicated by arrows in FIG. 10), whereby the internal space of the housing 41 and the cover 42 may be vacuumized in step S15.

Tube Sealing Step (S16)

Figure 11:
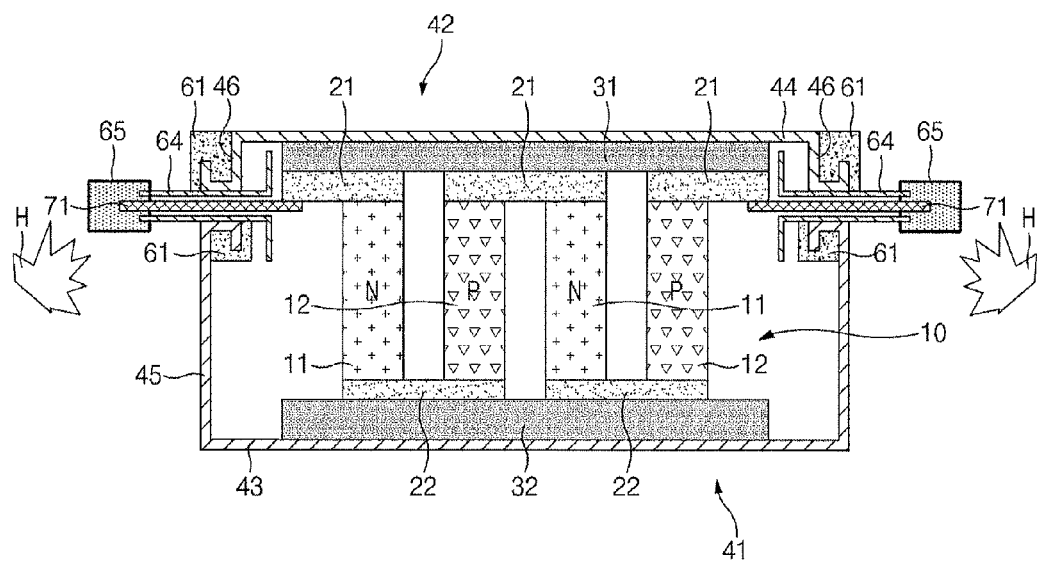
FIG. 11 illustrates a tube sealing step in a method for packaging a thermoelectric module, according to various embodiments of the present invention.
Figure 12:
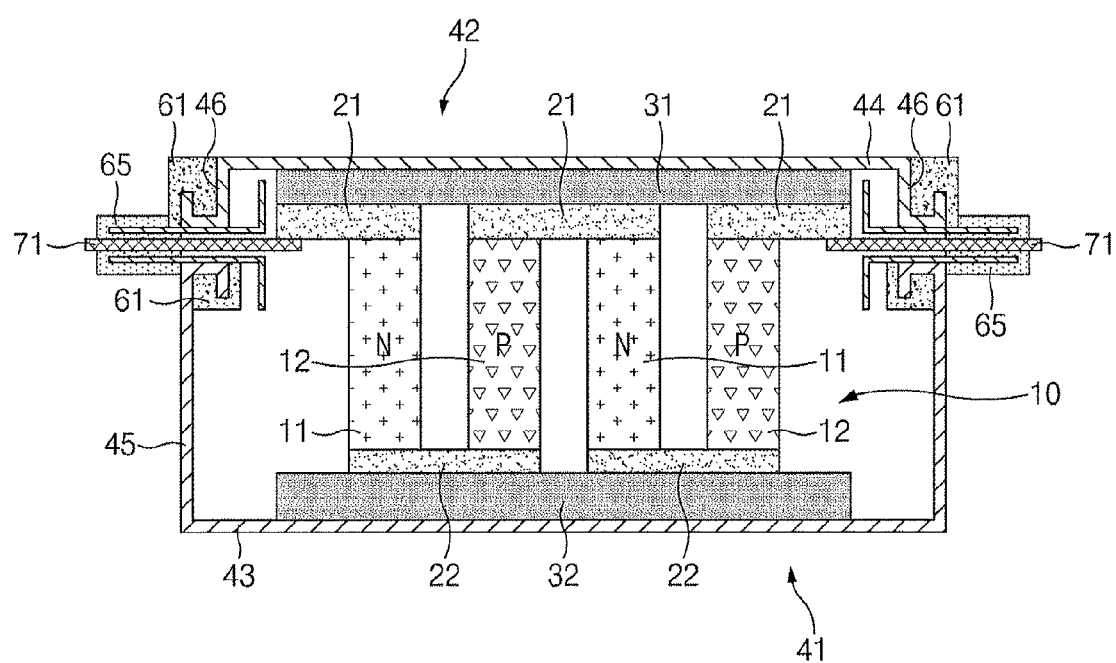
FIG. 12 illustrates a state in which a thermoelectric module is packaged by a housing, using a method for packaging a thermoelectric module, according to various embodiments of the present invention.

After the internal space of the housing 41 and the cover 42 is vacuumized, a sealing cap 65 may be provided on the outer end portion of the tube 64 as illustrated in FIG. 11. By applying heat H to the sealing cap 65, the outer end portion of the tube 64 may be sealed by the sealing cap 65 as illustrated in FIG. 12.

The sealing cap 65 may be formed of an insulating resin material to implement the sealing of the tube 64 and the insulation of the electric wire 71.

In addition, the sealing cap 65 may be formed of a heat shrinkable material. By applying the heat to the sealing cap 65 formed of the heat shrinkable material, the sealing cap 65 formed of the heat shrinkable material may be thermally shrunk and attached to the external and internal surfaces of the tube 64, thereby firmly sealing the end portion of the tube 64. Furthermore, the sealing cap 65 may also be attached to a portion of the external surface of the electric wire 71, whereby the insulating properties of the electric wire 71 may also be secured.

Figure 13:
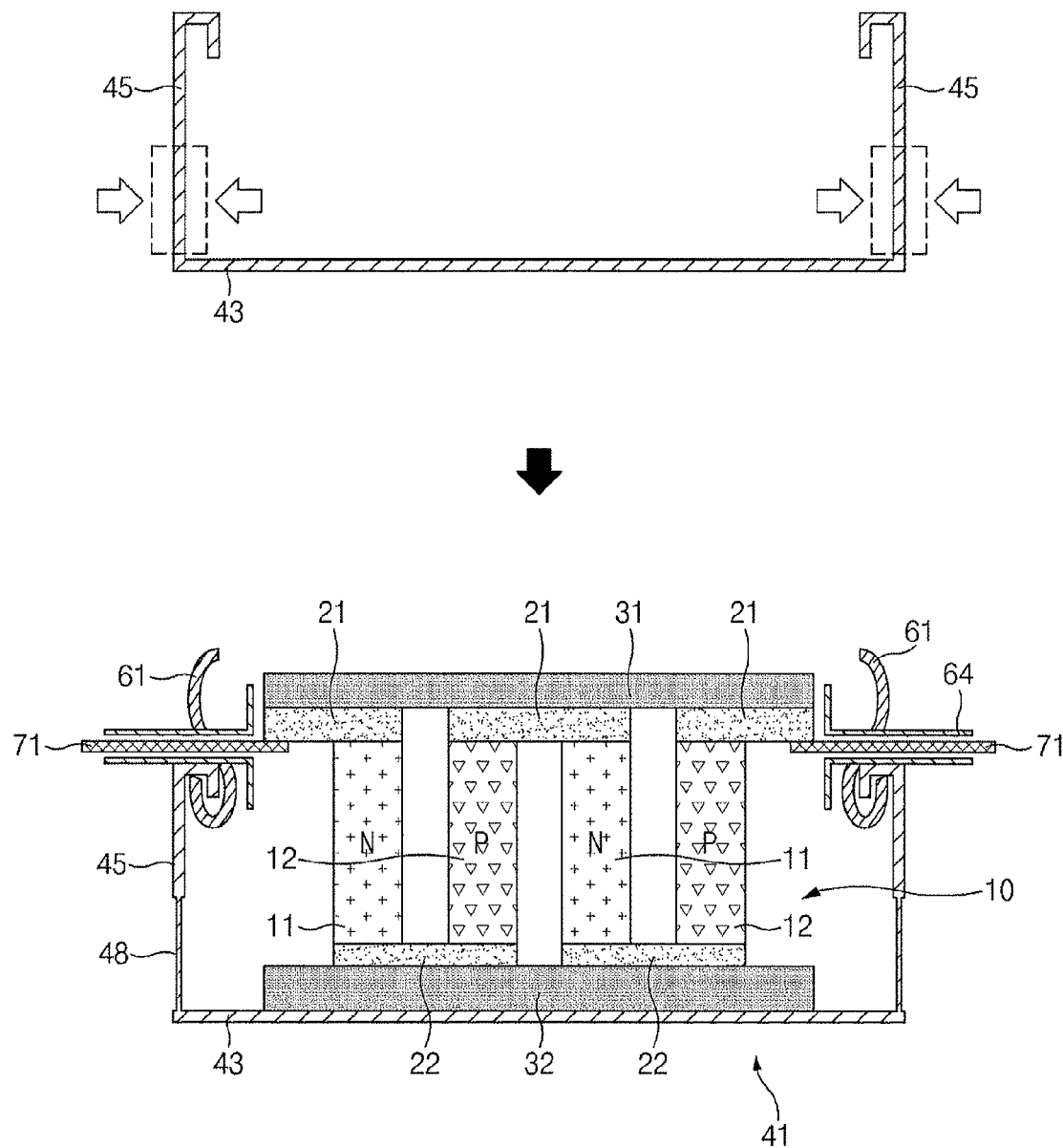
FIG. 13 illustrates a step for forming a thin wall portion in a method for packaging a thermoelectric module, according to various embodiments of the present invention.
Figure 14:
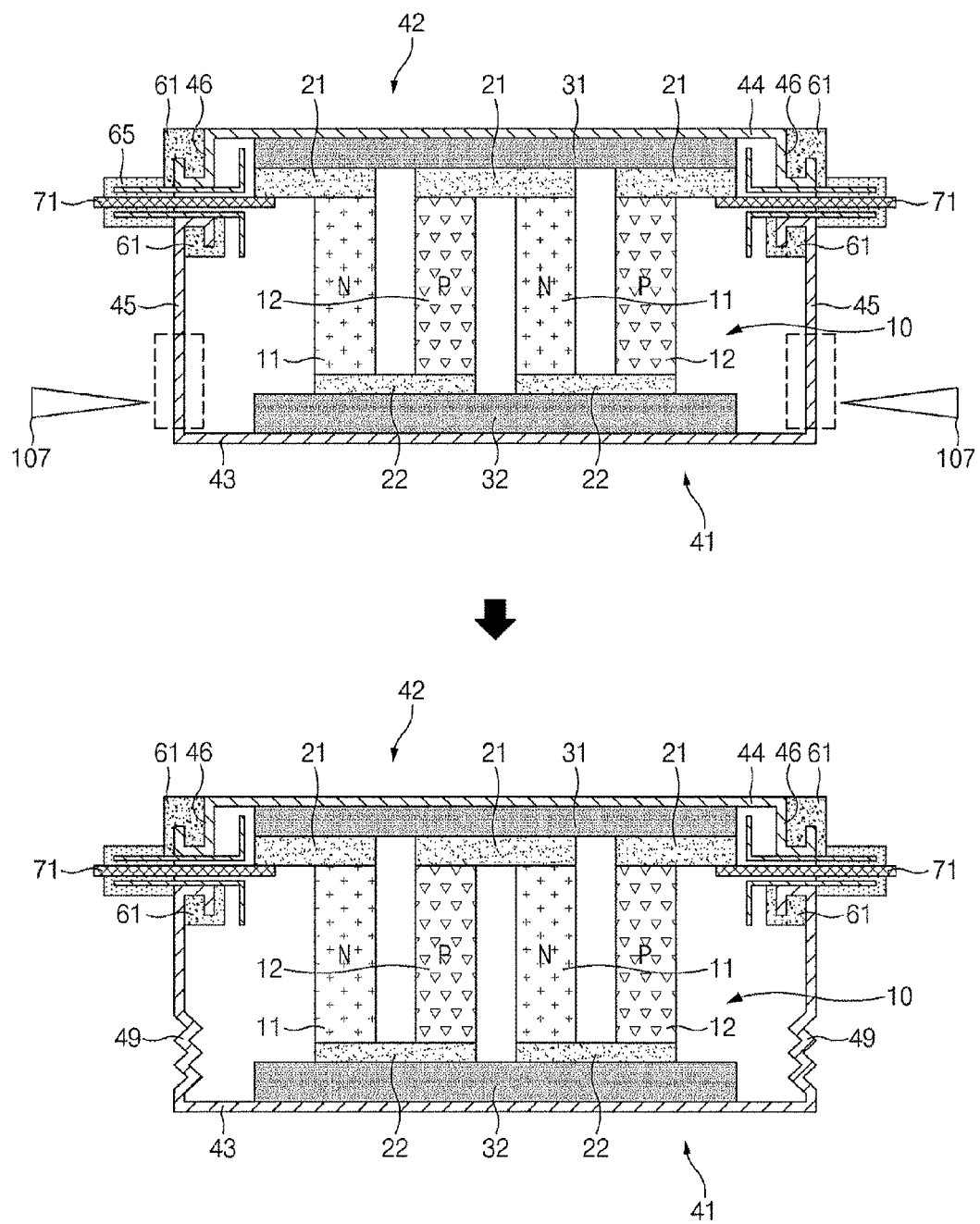
FIG. 14 illustrates a step for forming a non-straight portion in a method for packaging a thermoelectric module, according to various embodiments of the present invention.

Meanwhile, as illustrated in FIGS. 13 and 14, the method may further include a step for forming a thermal resistance increasing part 48 or 49 before the thermoelectric module accommodation step or after the bonding step. The thermal resistance increasing part 48 or 49 may be provided to increase thermal resistance at the sidewall 45 of the housing 41 or the sidewall 46 of the cover 42, thereby minimizing the flow or transfer of heat through the sidewall 45 of the housing 41 or the sidewall 46 of the cover 42.

Referring to FIG. 13, a thin wall portion 48 may be formed in a portion of the sidewall 45 of the housing 41 or the sidewall 46 of the cover 42, before the thermoelectric module accommodation step S1 or S11.

As illustrated in FIG. 13, by pressurizing the portion of the sidewall 45 of the housing 41 using a pressure means, the thickness of the portion of the sidewall 45 may be reduced to form the thin wall portion 48. Thermal resistance may be increased by the thin wall portion 48. After the thermal resistance increasing part 48 such as the thin wall portion 48 is formed, the thermoelectric module 10 may be accommodated in the housing 41.

Referring to FIG. 14, before the thermoelectric module accommodation step S1 or S11 or after the bonding step S4 or S14, a non-straight portion 49 may be formed to have a zigzag structure or a curved structure in a portion of the sidewall 45 of the housing 41 by various processing means 107, and thus, thermal resistance may be increased by the non-straight portion 49.

According to various embodiments, the method may further include a step for providing a cooling unit 80 or 90 to be adjacent to the low temperature part of the thermoelectric module 10 after at least one thermoelectric module 10 is hermetically packaged by the housing 41 and the cover 42 that are bonded by the bonding member 61.

Here, a portion 85 or 95 of the cooling unit 80 or 90 may be extended to contact or be adjacent to at least a portion of the bonding member 61.

Figure 15:
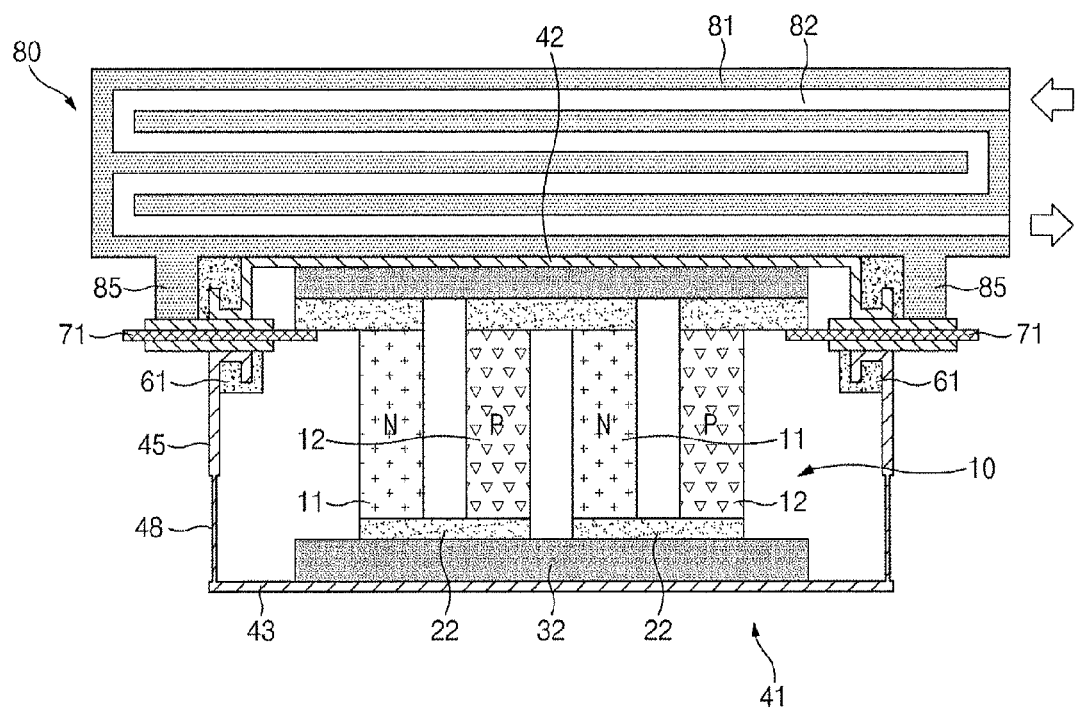
FIG. 15 illustrates a cooling unit installation step after a thermoelectric module is packaged in a method for packaging a thermoelectric module, according to various embodiments of the present invention.
Figure 16:
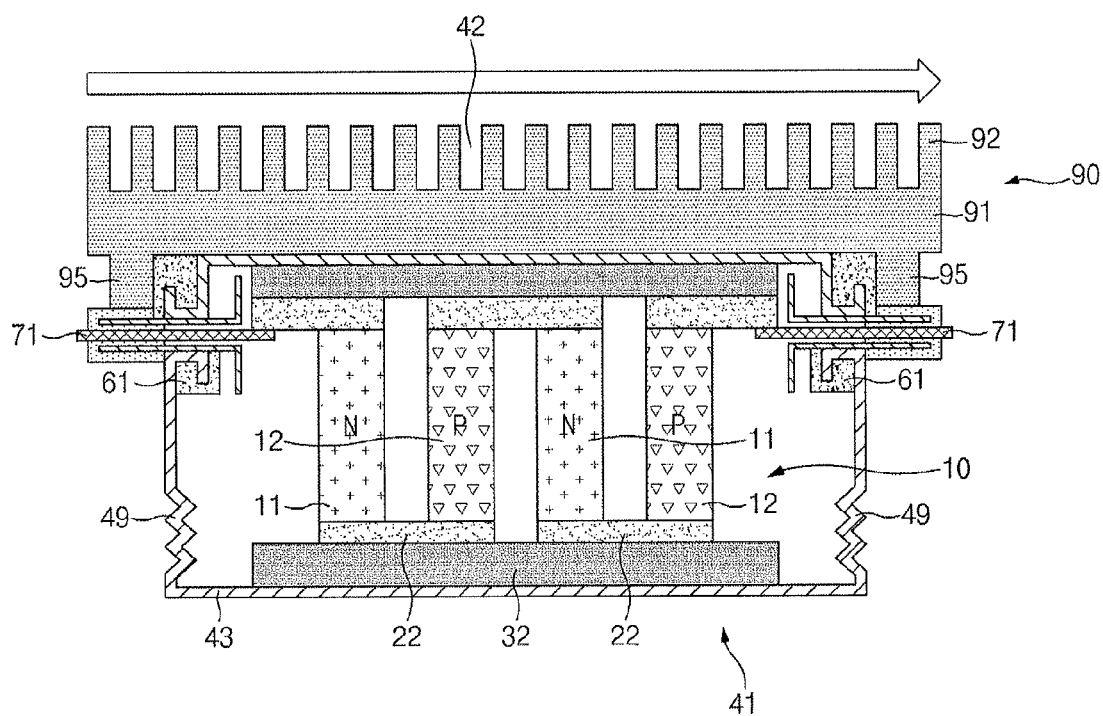
FIG. 16 illustrates a cooling unit installation step after a thermoelectric module is packaged in a method for packaging a thermoelectric module, according to various embodiments of the present invention.

Referring to FIGS. 15 and 16, the cooling unit 80 or 90 may be provided on the top portion 44 of the cover 42, such that the first insulating board 31 of the thermoelectric module 10 and parts adjacent thereto may form the low temperature part.

The cooling unit 80 according to the various embodiments of FIG. 15 includes a cooling body 81 having a channel 82 through which a cooling fluid such as coolant passes, and an extension portion 85 extending from one side of the cooling body 81 toward the bonding member 61.

The extension portion 85 may contact or be adjacent to at least a portion of the bonding member 61 such that cool air of the cooling body 81 may be transferred to the bonding member 61, thereby preventing heat strain or damage of the bonding member 61 and effectively preventing strain, dielectric breakdown, electrical shorting or the like of the electric wire 71.

The cooling unit 90 according to the various embodiments of FIG. 16 includes a cooling body 91 having cooling fins 92 through which a vapor-phase cooling fluid such as air passes, and an extension portion 95 extending from one side of the cooling body 91 toward the bonding member 61.

The extension portion 95 may contact or be adjacent to at least a portion of the bonding member 61, such that cool air of the cooling body 91 may be transferred to the bonding member 61, thereby preventing heat strain or damage of the bonding member 61 and effectively preventing strain, dielectric breakdown, electrical shorting or the like of the electric wire 71.

According to various embodiments, the housing and the cover may package the external surface of the thermoelectric module, i.e., the external surfaces of the insulating boards and the thermoelectric elements and the electrodes disposed between the insulating boards, thereby effectively preventing an oxidation reaction, chemical changes, and the like that may be caused by external factors, avoid electrical shorting that may be caused by moist, conducting liquid or the like, and protect the individual elements of the thermoelectric module from stress, strain, shear force and the like due to external physical factors.

In addition, the housing and the cover may be firmly bonded by the bonding member, thereby effectively pressurizing the insulating boards, the electrodes, and the thermoelectric elements. Thus, electric resistance and thermal resistance at interfaces of the thermoelectric elements and the electrodes due to temperature changes may be minimized, and thermal resistance at interfaces of the electrodes and the insulating boards may also be minimized.

For convenience in explanation and accurate definition in the appended claims, the terms "upper" or "lower", "inner" or "outer" and etc. are used to describe features of the exemplary embodiments with reference to the positions of such features as displayed in the figures.

The foregoing descriptions of specific exemplary embodiments of the present invention have been presented for purposes of illustration and description. They are not intended to be exhaustive or to limit the invention to the precise forms disclosed, and obviously many modifications and variations are possible in light of the above teachings. The exemplary embodiments were chosen and described in order to explain certain principles of the invention and their practical application, to thereby enable others skilled in the art to make and utilize various exemplary embodiments of the present invention, as well as various alternatives and modifications thereof. It is intended that the scope of the invention be defined by the Claims appended hereto and their equivalents.

What is claimed is:

1. A method for packaging a thermoelectric module, the method comprising:
    thermoelectric module accommodation step, of accommodating at least one thermoelectric module in a housing having a base and a sidewall;
    electric wire sealing step, of sealing an electric wire of the thermoelectric module with a sealing tube;
    bonding member interposing step, of placing a cover having a top portion and a sidewall on top of the housing and interposing a bonding member between the sidewall of the housing and the sidewall of the cover; and
    bonding step, of bonding the sidewall of the housing and the sidewall of the cover that are hermetically sealed by the bonding member,
    wherein the bonding member comprises a resin material.

2. The method according to claim 1, wherein the bonding member interposing step includes passing the sealing tube through a portion of the bonding member.

3. The method according to claim 1, wherein the bonding member interposing step includes inserting a first portion of the bonding member into a top of the sidewall of the housing and inserting a second portion of the bonding member into a bottom of the sidewall of the cover.

4. The method according to claim 1, wherein the bonding step includes applying heat to the bonding member in a vacuum or inert atmosphere for the bonding member to be melted and cured between a top of the sidewall of the housing and a bottom of the sidewall of the cover to hermetically seal a top of the sidewall of the housing and a bottom of the sidewall of the cover.

5. The method according to claim 1, wherein the sealing tube comprises a heat shrinkable tube, and the electric wire is sealed by applying heat to the heat shrinkable tube.

6. The method according to claim 1, wherein the bonding member comprises a heat shrinkable film.

7. The method according to claim 1, further comprising forming a thermal resistance increasing part in at least one of the sidewall of the housing and the sidewall of the cover, before the thermoelectric module accommodation step or after the bonding step.

8. The method according to claim 1, wherein a portion of the sidewall of the housing is pressurized to form a thin wall portion that is thinner than the sidewall of the housing, before the thermoelectric module accommodation.

9. The method according to claim 1, wherein a portion of the sidewall of the housing is processed to form a non-straight portion, before the thermoelectric module accommodation step or after the bonding step.

10. A method for packaging a thermoelectric module, the method comprising:
- thermoelectric module accommodation step, of accommodating at least one thermoelectric module in a housing having a base and a sidewall;
- tube installation step, of providing a tube having an inner diameter greater than an outer diameter of an electric wire of the thermoelectric module on a periphery of the electric wire to form a gap between the electric wire and the tube;
- bonding member interposing step, of placing a cover having a top portion and a sidewall on top of the housing and interposing a bonding member between the sidewall of the housing and the sidewall of the cover;
- bonding step, of bonding the sidewall of the housing and the sidewall of the cover that are hermetically sealed by the bonding member;
- vacuumizing step, of vacuumizing an internal space of the housing and the cover through the gap between the electric wire and the tube; and
- tube sealing step, of sealing the tube after the vacuumizing,
- wherein the bonding member is formed of a resin material.

11. The method according to claim 10, wherein the vacuumizing step includes injecting an inert gas through the gap between the electric wire and the tube.

12. The method according to claim 10, wherein a heat resistant cap is provided on an outer end portion of the tube, between the bonding member interposing step and the bonding step.

13. The method according to claim 10, wherein the tube sealing step includes providing a sealing cap on an outer end portion of the tube and applying heat thereto to seal the outer end portion of the tube through melting and curing of the sealing cap.

14. The method according to claim 10, wherein the bonding member interposing step includes passing the tube through a portion of the bonding member.

15. The method according to claim 10, wherein the bonding member interposing step includes inserting a first portion of the bonding member into a top of the sidewall of the housing and inserting a second portion of the bonding member into a bottom of the sidewall of the cover.

16. The method according to claim 10, wherein the bonding member is formed of a heat shrinkable film.

17. The method according to claim 10, further comprising forming a thermal resistance increasing part in the sidewall of the housing or the sidewall of the cover, before the thermoelectric module accommodation step or after the bonding step.

18. The method according to claim 10, wherein a portion of the sidewall of the housing is pressurized to form a thin wall portion that is thinner than the sidewall of the housing, before the thermoelectric module accommodation step.

19. The method according to claim 10, wherein a portion of the sidewall of the housing is processed to form a non-straight portion, before the thermoelectric module accommodation step or after the bonding step.

* * * * *